United States Patent
Higuchi

(10) Patent No.: US 6,566,931 B2
(45) Date of Patent: May 20, 2003

(54) SEMICONDUCTOR INTEGRATED CIRCUIT DEVICE WITH LEVEL SHIFT CIRCUIT

(75) Inventor: Fujio Higuchi, Yamagata (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/912,034

(22) Filed: Jul. 24, 2001

(65) Prior Publication Data

US 2002/0014637 A1 Feb. 7, 2002

(30) Foreign Application Priority Data

Jul. 25, 2000 (JP) ........................... 2000-224435

(51) Int. Cl.[7] ................................. G05F 3/02
(52) U.S. Cl. ........................ 327/333; 327/538
(58) Field of Search ................. 327/333, 534, 327/536, 539, 143, 538, 198

(56) References Cited

U.S. PATENT DOCUMENTS

| | | | |
|---|---|---|---|
| 4,996,686 A | * | 2/1991 | Imai et al. ........... 257/239 |
| 5,694,072 A | * | 12/1997 | Hsaio et al. ......... 327/536 |
| 6,020,781 A | * | 2/2000 | Fujioka ............... 327/142 |
| 6,201,437 B1 | * | 3/2001 | Kono et al. .......... 327/143 |
| 6,205,079 B1 | * | 3/2001 | Namekawa ........... 327/536 |

FOREIGN PATENT DOCUMENTS

JP    2-228064    9/1990    ........ H01L/27/04

* cited by examiner

Primary Examiner—Terry D. Cunningham
(74) Attorney, Agent, or Firm—Hayes Soloway P.C.

(57) ABSTRACT

A semiconductor integrated circuit device, which is driven using Vd1 supplied to external power supply terminal 3 and which includes internal circuit 10 with desired functions, such as a CPU, comprises step-up circuit 13, which steps up Vd1 at a predetermined step-up ratio k and outputs Vd2 (=k×Vd1); and voltage detecting circuit 15, which is driven using Vd2 as a power supply and which compares a predetermined Vref1 to Vd3 (=a×Vd2) given by dividing Vd2 with dividing ratio a and outputs the resultant Vcp1. In addition, the semiconductor integrated circuit device with the voltage detecting circuit that can detect the power supply voltage accurately and surely even if the power supply voltage provided externally falls to 1 V or lower, comprises oscillation circuit 19 and level shift circuit 17, which is driven using Vd1 as a power supply and which changes the Vcp1 level and outputs Vcp2.

6 Claims, 3 Drawing Sheets

SEMICONDUCTOR INTEGRATED CIRCUIT DEVICE WITH LEVEL SHIFT CIRCUIT

BACKGROUND OF THE INVENTION

1. Field of the Invention

The present invention relates to a semiconductor integrated circuit device incorporating a voltage detecting circuit; in particular it relates to a semiconductor integrated circuit device incorporating a voltage detecting circuit that can detect the drop in operating power supply voltage.

2. Description of the Prior Art

To prevent malfunction of a semiconductor integrated circuit device (hereafter, referred to as LSI) from occurring when voltage rises at the time of energization start-up, or when the power supply voltage drops during operation, a method that is well-known involves the monitoring of the power supply voltage by a power supply voltage detecting circuit provided and the transmission of a reset signal to halt the operation of the LSI when the power supply voltage becomes lower than that specified.

For example, in Japanese Patent Application Laid-Open No. Hei 2-228064 (hereafter, referred to as the well-known example), an example of a voltage detecting circuit that can detect a drop in operating power supply voltage is disclosed. FIG. 1 is a block diagram showing the configuration of a detecting circuit that is disclosed in this well-known example.

Referring to FIG. 1, this conventional detecting circuit 550, which comprises step-up circuit 513, reference voltage generation circuit 515, voltage dividing circuit 517, comparator 519, and interface circuit 521, is mounted on a single semiconductor chip comprising both bipolar elements and CMOS elements.

Step-up circuit 513 with a configuration equivalent to that of a well-known DC—DC converter converts the power supply voltage Vcc, which is supplied to bipolar elements, (e.g., 1.5 V), which is supplied to terminal 511 to alternating voltage, steps it up, and then reconverts it to direct-current voltage $V_{DD}$ (e.g., 3.6 V) which can drive a CMOS circuit, and supplies voltage $V_{DD}$ to the CMOS logic circuit (not shown in the drawing) via terminal 514.

Reference voltage generation means 155 consists of constant-current source Io, resistance R11, and PN junction diode Q1, generating reference first voltage $V_N$ at connection point P. $V_N$ can be set to a desired value by changing the resistance R11 value. Diode Q1 is connected between the base and the emitter of NPN transistor Q2, transistor Q2 thus operates as a current source.

Voltage dividing means 517, consisting of resistances R12 and R13, provides second voltage $V_d$ at connection point S by dividing stepped-up voltage $V_{DD}$. In other words, $V_d = V_{DD} \times (R13/(R12+R13))$.

Comparator 519 is a differential amplifier that has PNP transistors Q5 and Q6 as load elements, NPN transistors Q3 and Q4 as driving elements, and NPN transistor Q2 as a current source element. One input terminal IN1 is connected to connection point S, whereas the other input terminal IN2 is connected to connection point P. Output terminal OUT1 is connected to interface circuit 521 via terminal 520.

Interface circuit 521 consists of resistance R14 and NPN transistor Q7. When voltage $V_{O1}$ of comparator output terminal 520 is high level, voltage $V_{O2}$ of detection signal transmission terminal 522 (connection point T) is equal to saturation voltage $V_{CE}$ (sat) between the collector and the emitter of transistor Q7; when voltage $V_{O2}$ is low level, voltage $V_{O2}$ is approximately equal to $V_{DD}$.

FIG. 2 is a schematic for describing an overview of the operation of detecting circuit 550, wherein the horizontal axis is time t, the vertical axis shows reference voltage (first voltage) $V_N$, stepped-up voltage $V_{DD}$, and second voltage (divided voltage) $V_d$. When time t=0, standby mode is cancelled initiating the operation of step-up circuit 513. Curves 541, 542, and 543 in FIG. 2 indicate the relationships between each of $V_N$, $V_{DD}$, and $V_D$ and time t, respectively. $V_{DDX}$ is a preferred, to-be-detected stepped-up voltage that has been specified in advance. Circuit constants for reference voltage generation means 515 and voltage dividing means 517 are preset to values that satisfy the relationship of divided voltage $V_{dx}$ of stepped-up voltage $V_{DDX}$ being equal to reference voltage $V_N$. Therefore, when $V_{DD}<V_{DDX}$, $V_d<V_N$ and accordingly voltage information $V_{O1}$ of output terminal 520 of the comparator is high level; whereas when $V_{DD}>V_{DDX}$, $V_d>V_N$, and consequently voltage information $V_{O1}$, is low level. Accordingly, the to-be-detected, stepped-up voltage $V_{DDX}$ can be detected.

In the conventional detecting circuit 550 described above, since reference voltage generation means 515 and comparator 519, which are configured using bipolar elements that can be activated by a power supply that is externally supplied to bipolar elements of a low voltage to detect the stepped-up voltage, the detection of low voltage down to a certain point becomes sufficiently possible.

However, in the conventional detecting circuit 550, both reference voltage generation means 515 and comparator 519 are driven by power supply voltage $V_{CC}$, which is supplied for bipolar circuits. This configuration develops a problem where the stability of reference voltage $V_N$ that is generated by voltage generation means 515 against temperature change is degraded, particularly at the supplied voltage 1 V or lower; and accordingly, the fluctuation in the reference voltage becomes larger. This makes it difficult to generate, for example, a power-on/reset signal accurately in such a case of low voltage.

SUMMARY OF THE INVENTION

Accordingly, the objective of the present invention is to provide an LSI, which comprises a voltage detecting circuit that can detect the power supply voltage accurately and surely, even if the power supply voltage supplied externally falls to 1 V or less.

Therefore, an LSI, according to the present invention, which is driven by the first voltage as a power supply supplied to an external power supply terminal to drive internal circuits with desired functions, such as a CPU or peripheral circuits, comprises at least: a step-up circuit, which is driven by the first voltage supplied to an external power supply terminal as a power supply and which steps up the first voltage at a predetermined ratio into a second voltage and outputs it; a voltage detecting circuit, which is driven by the second voltage as a power supply and which compares a predetermined reference voltage to a divided voltage given by dividing the second voltage and outputs a first comparison result signal; and a level shift circuit, which is driven using the first voltage as a power supply and which changes the level of the first comparison result signal to outputs a second comparison result signal.

At this time, the voltage detecting circuit may comprise at least a reference voltage generating circuit, which generates a reference voltage; a dividing circuit which divides the second voltage into a divided voltage; and a comparison circuit which inputs the reference voltage and the divided voltage and outputs a first comparison result signal.

Furthermore, the level shift circuit may be configured so that the ratio of the second voltage to the first voltage is equal to that of the first comparison result signal level to the second comparison result signal level.

It is noted that the second comparison result signal may be used as a reset signal for resetting an internal circuit when the divided voltage is lower than the reference voltage.

Furthermore, it is preferable that the reference voltage generating circuit is structured with a bandgap circuit.

Features of the LSI according to the present invention are: including a voltage detecting circuit and other internal circuits; stepping up a detected voltage from the voltage detecting circuit onto an appropriate voltage by the step-up circuit; and driving the voltage detecting circuit by the stepped-up voltage, which is provided by the step-up circuit.

DETAILED DESCRIPTION OF THE PREFERRED EMBODIMENTS

Figure 1:
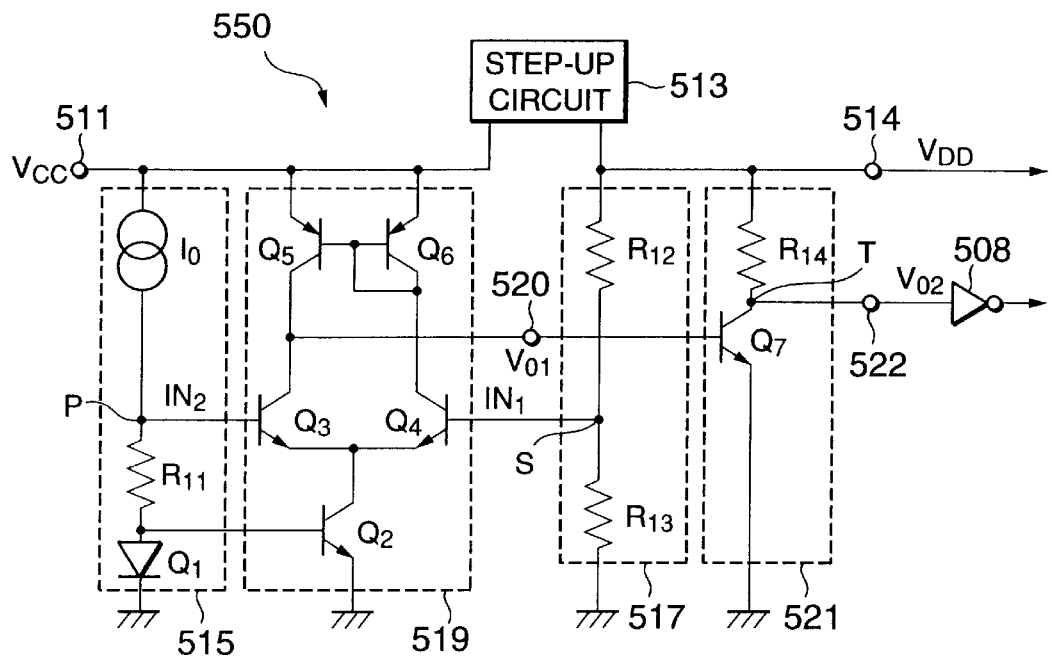
FIG. 1 is a block diagram showing the structure of the detecting circuit that is disclosed in Japanese Patent Application Laid-open No. Hei 2-228064.
Figure 2:
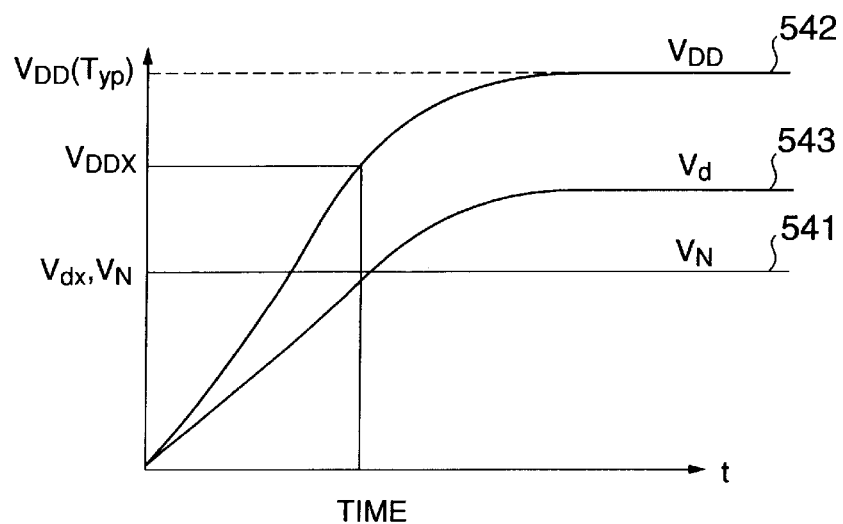
FIG. 2 is a graph indicating the characteristics of the detecting circuit in FIG. 1 after the operation of stepping the voltage up is initiated.
Figure 3:
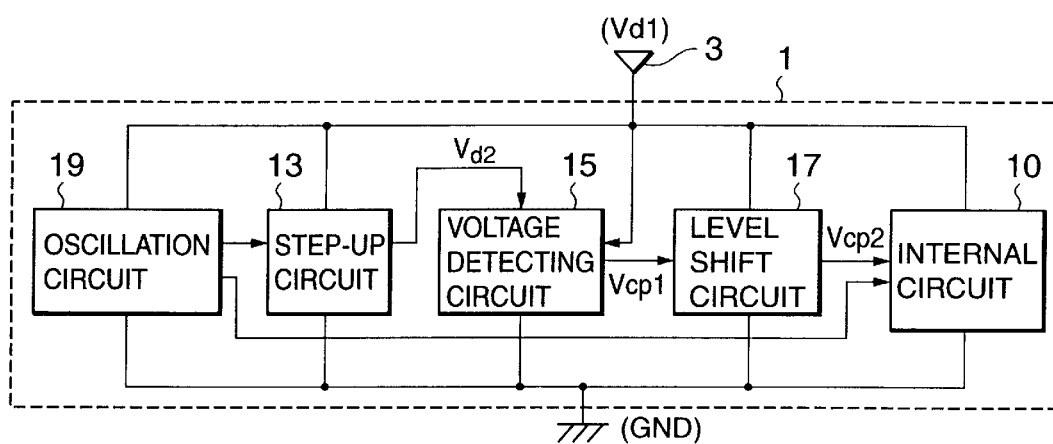
FIG. 3 is a block diagram showing an embodiment of the semiconductor integrated circuit device of the present invention.
Figure 4:
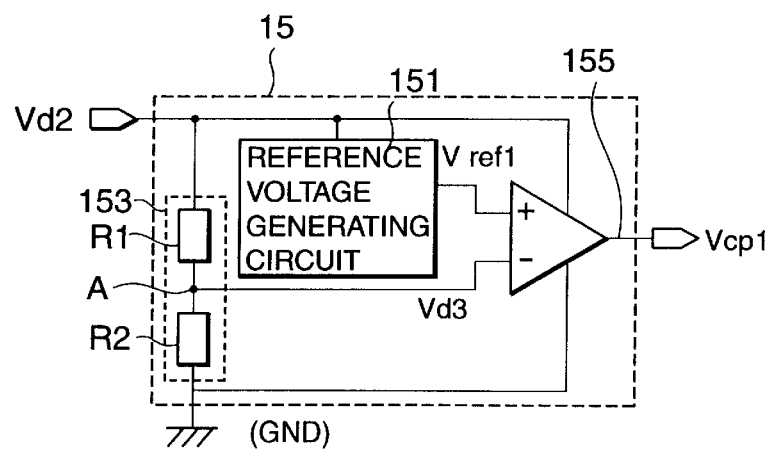
FIG. 4 is a block diagram indicating an overview of the voltage detecting circuit in FIG. 3.
Figure 5:
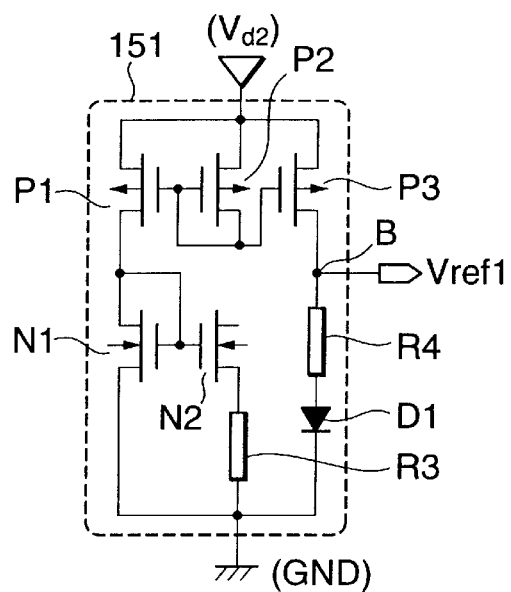
FIG. 5 is a circuit diagram showing a concrete example when the reference voltage generating circuit in FIG. 4 is structured with a bandgap circuit.

Referring to FIG. 3 and FIG. 5, LSI 1 of this embodiment is comprised of internal circuit 10, which has desired functions such as a CPU and which is driven by a first voltage (hereafter, referred to as Vd1) supplied to external power supply terminal 3; step-up circuit 13, which steps up Vd1 at designated step-up ratio k (where k is a real number greater than 1) and outputs a second voltage (hereafter referred to as Vd2 (=k×Vd1)); voltage detecting circuit 15, which is driven using Vd2 as a power supply and which compares a predetermined reference voltage (hereafter referred to as Vref1) to the divided voltage (hereafter, referred to as Vd3 (=a×Vd2), which is provided by dividing Vd2 by ratio a, outputting the resulting first comparison result signal (hereafter, referred to as Vcp1); level shift circuit 17, which is driven using Vd1 as a power supply and which changes the first comparison result signal level to the second comparison result signal (hereafter, referred to as Vcp2) and outputs it; and oscillation circuit 19. This dividing ratio a is set to a value according to the equation a=Vref1/(k×Vd0) where Vd0 denotes the first voltage to be detected, and level shift circuit 17 is constructed so as to approximately satisfy the equation Vcp2= (Vcp1/k). Moreover, the output terminal of level shift circuit 17 is connected to the reset signal input terminal in internal circuit 10. In the following description, the same markers as Vd0, Vd1, Vd2, Vd3, Vref1, Vcp1, and Vcp2 are used without distinguishing the signal names and voltage values.

Voltage detecting circuit 15 comprises reference voltage generating circuit 151, which generates Vref1; dividing circuit 153, which divides Vd2 and outputs Vd3; and comparison circuit 155 which inputs Vref1 and Vd3 and outputs Vcp1. For example, when first resistance element R1, which has a resistance value r1 and has one terminal connected to Vd2, and second resistance element R2, which has a resistance value r2 and has one terminal connected to the ground, are connected in a series, and r1 and r2 are decided based on a=r2/(r1+r2), then dividing circuit 153 may be configured with the series connection point between first resistance element R1 and second resistance element R2 being the output terminal of Vd3. It is noted here that if it is assumed that k=2, Vd0 0.7 V, and Vref1=1.2 V, for example, then it follows that a=1.2/(2×0.7)=0.86, Vd2=2Vd1, Vcp2=Vcp1/2, and Vd3=(0.86×Vd2). In addition, comparison circuit 155 outputs high level signal when Vd3<Vref1; whereas it outputs low level signal when Vd3>Vref1.

It is noted that, the specified bandgap circuit shown in FIG. 5, for example, may be used for reference voltage generating circuit 151. Reference voltage generating circuit 151, which uses this bandgap circuit, comprises first series connection part, where first P-channel-type MOS transistor (hereafter, referred to as PMOS) P1 which connects second voltage Vd2 and ground is connected to first N-channel type MOS transistor (hereafter, referred to as NMOS) N1 in series in this order from the Vd2 side; a second series connection part, where second PMOS P2, second NMOS N2, and third resistance element R3 are connected in series in this order from the Vd2 side; and a third series connection part, where third PMOS P3, fourth resistance element R4, and diode D1 are connected in series in this order from the Vd2 side. The respective gates of first NMOS N1 and second NMOS N2 are connected to the series connection point of first PMOS P1 and first NMOS N1; the respective gates of first PMOS P1 and second PMOS P2 are connected to the series connection point of second PMOS P2 and second NMOS N2; and series connection point B of third PMOS P3 and fourth resistance element R4 is used as the output terminal of reference voltage Vref1.

Moreover, oscillation circuit 19 supplies a step-up clock to drive step-up circuit 13, and a clock signal to internal circuit 10, as necessary.

Figure 6:
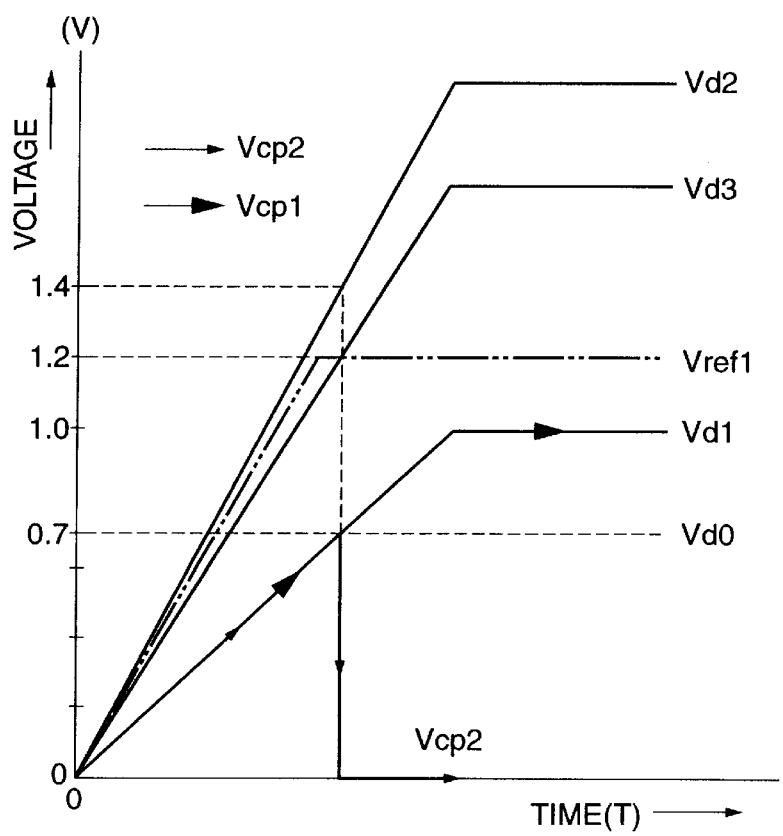
FIG. 6 is a graph showing changes in primary terminal voltage after the LSI in FIG. 3 is energized, wherein the horizontal axis is time T, and vertical axis shows voltage V.

Next, the power supply voltage detecting operation of LSI 1 of this embodiment, which is configured as described above, is detailed. FIG. 6 is a graph showing changes in primary terminal voltages after LSI 1 is energized. In this graph, the horizontal axis is time T with T=0 as the energization start-up time, and the vertical axis shows voltage V. In the following, the present invention is described while referencing FIG. 3 to FIG. 6.

To begin with, when LSI 1 is energized to cause first voltage Vd1 to start rising, oscillation circuit 19 and step-up circuit 13 start operating, and second voltage Vd2 is output. Here, it is assumed that the step-up ratio of step-up circuit 13 is set to 2 (i.e., Vd2=2×Vd1) as described above. When Vd2 starts rising, voltage detecting circuit 15 then starts operation. Voltage detecting circuit 15 generates divided voltage Vd3 at series connection point A between first resistance element R1 and second resistance element R2, which configure divider 153, and at the same time reference voltage generating circuit 151 generates reference voltage Vref1. Divided voltage Vd3 and the generated reference voltage Vref1 are input to the negative input terminal and positive input terminal, respectively, of comparison circuit 155, which then outputs first comparison result signal Vcp1. Output signal Vcp1 of this comparison circuit 155 goes high when Vd3<Vref1, whereas it goes low when Vd3>Vref1. Level shift circuit 17 is driven by Vd1, inputs Vcp1, outputs second comparison result signal Vcp2 having a signal level corresponding to Vd1, and inputs it to internal circuit 10 as a reset signal. It is noted that a high level Vcp2 denotes a reset-on mode, whereas a low level Vcp2 denotes a reset cancellation mode.

In this embodiment, since k=2, Vd0=0.7 V, and Vref1=1.2 V, and accordingly, a=0.86, Vd2=2×Vd1, Vcp2=Vcp1/2, and Vd3=(0.86×Vd2) are specified, it follows that Vd1=Vd0= 0.7 V; Vd2=2×Vd1=1.4 V is detected; if Vd1 is less than 0.7 V, then internal circuit 10 stays in reset mode; whereas if Vd1 exceeds 0.7 V, then internal circuit 10 becomes reset release mode and starts operating.

As described above, LSI 1 of the present embodiment comprises step-up circuit 13, which steps up Vd1 at step-up ratio k even in the case when the detecting point Vd0 of power supply voltage Vd1 that is supplied externally is 1 V or less; and voltage detecting circuit 15, which is driven by the Vd2 that is output from step-up circuit as a power supply; wherein, by having both reference voltage Vref1, which is generated from reference voltage generating circuit 151 in voltage detecting circuit 15, and dividing ratio a of dividing circuit 153 being set so that a=Vref1/(k×Vd0) where Vref1 is 1 V or greater, the detection of detecting point Vd0 can be performed surely and stably even when there is, for instance, temperature variation.

Therefore, even if the operating voltage of the LSI is further lowered, or the LSI operates at an extremely low voltage where the supplied external power supply voltage Vdd is 1 V or less, possible malfunction, which may occur at energization start-up time and which may happen due to a drop of the power supply voltage during operation, can be prevented by setting Vd0=Vdd (min.), where Vdd (min.) denotes the external power supply voltage at which the LSI starts operating normally, and inputting second comparison result signal Vcp2 to the reset terminal of the LSI.

Furthermore, according to LSI 1 of this embodiment, the driving capability of step-up circuit 13, as well as a possible increase in LSI 1 chip size, can be minimized by limiting the circuit driven by stepped-up voltage Vd2 as a power supply to only the minimally necessary voltage detecting circuit 15.

It is noted that, the present invention is not limited to the embodiment described above; however, needless to say, it may include various alternatives within the range where the relationship of a=Vref1/(k×Vd0) is kept and Vref1 is set to a value within a stable range (normally, 1 V or more) against temperature variation.

As described above, the LSI of the present invention is advantageous in that since the reference voltage can be set to a stable level against possible variations in temperature or other causes to allow for comparison of the stepped-up voltage of a to-be-detected voltage to this reference voltage, even a to-be-detected voltage of 1 V or lower can be surely and stably detected; therefore, by using this detection result, a possible malfunction of the LSI at energization start-up time or a drop in the power supply voltage during operation can be prevented from occurring; and in addition to this, by limiting the circuit driven using the stepped-up voltage as a power supply to only the minimally necessary voltage detecting circuit, the driving capability of the step-up circuit can be reduced to minimize a possible increase in LSI 1 chip size.

What is claimed is:

1. The semiconductor integrated circuit device, comprising:

a step-up circuit being driven by a first voltage supplied to an external power supply terminal as a power supply, said step-up circuit outputting a second voltage by stepping up said first voltage at a predetermined ratio;

a voltage detecting circuit being driven by said second voltage as a power supply, said voltage detecting circuit outputting a first comparison result signal by comparing a predetermined reference voltage to a divided voltage given by dividing said second voltage; and a level shift circuit being driven using said first voltage as a power supply, said level shift circuit outputting a second comparison result signal by changing level of said first comparison result signal, wherein said level shift circuit is configured so that the ratio of said second voltage to said first voltage is equal to that of said first comparison result signal level to said second comparison result signal level.

2. The semiconductor integrated circuit device according to claim 1, wherein said voltage detecting circuit comprises a reference voltage generating circuit, which generates a reference voltage; a dividing circuit, which divides said second voltage into a divided voltage; and a comparison circuit, which inputs said reference voltage and said divided voltage, and outputs a first comparison result signal.

3. The semiconductor integrated circuit device according to claim 2, wherein said dividing circuit comprises a series connection part, which is structured with a first resistance element and a second resistance element connected in series to each other through which said second voltage and ground are connected, and with the series connection point between said first resistance element and said second resistance element being used as an output terminal of said divided voltage.

4. The semiconductor integrated circuit device according to claim 2, wherein said reference voltage generating circuit is a bandgap circuit.

5. The semiconductor integrated circuit device according to claim 2, wherein said second comparison result signal becomes a reset signal for resetting an internal circuit that is connected to the output terminal of said level shift circuit when said divided voltage is lower than said reference voltage.

6. The semiconductor integrated circuit device according to claim 1, wherein said first voltage is 1 V or lower.

* * * * *